(12) United States Patent
Lai

(10) Patent No.: US 8,981,418 B2
(45) Date of Patent: Mar. 17, 2015

(54) LED DEVICE WITH STRUCTURE FOR PRECISELY LOCATING LEDS THEREON AND METHOD FOR MANUFACTURING THE SAME

(75) Inventor: Chih-Chen Lai, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 1 day.

(21) Appl. No.: 13/572,684

(22) Filed: Aug. 12, 2012

(65) Prior Publication Data
US 2013/0214316 A1 Aug. 22, 2013

(51) Int. Cl.
*H01L 33/00* (2010.01)
*H01L 33/48* (2010.01)
*H05K 1/11* (2006.01)
*H05K 3/30* (2006.01)
*H05K 3/34* (2006.01)

(52) U.S. Cl.
CPC ..... *H01L 33/486* (2013.01); *H01L 2224/48091* (2013.01); *H01L 2924/00014* (2013.01); *H05K 1/111* (2013.01); *H05K 3/303* (2013.01); *H05K 3/3431* (2013.01); *H05K 2201/09663* (2013.01); *H05K 2201/0969* (2013.01); *H05K 2201/09745* (2013.01); *H05K 2201/10106* (2013.01); *H05K 2201/10984* (2013.01)

USPC ...... 257/99; 257/100; 257/676; 257/E33.066; 257/E33.056; 257/E33.057; 257/E33.058; 257/E33.059

(58) Field of Classification Search
USPC ............ 257/99, 676, E33.066, 100, E33.056, 257/E33.057, E33.058, E33.059
See application file for complete search history.

(56) References Cited

U.S. PATENT DOCUMENTS

| | | | |
|---|---|---|---|
| 2006/0125113 A1* | 6/2006 | Liu et al. | 257/778 |
| 2012/0182746 A1* | 7/2012 | Lai | 362/382 |
| 2012/0299036 A1* | 11/2012 | Liu et al. | 257/98 |
| 2013/0168722 A1* | 7/2013 | Lai | 257/99 |

* cited by examiner

*Primary Examiner* — Matthew W Such
*Assistant Examiner* — Samuel Lair
(74) *Attorney, Agent, or Firm* — Novak Druce Connolly Bove + Quigg LLP

(57) ABSTRACT

An SMT LED device includes an LED and a circuit board supporting the LED. A pair of first solder pads are formed on the circuit board and spaced from each other. The LED includes two solder slugs extending downwardly from a bottom the LED. A positioning hole is formed at each first solder pad corresponding a position of a corresponding solder slug. A second solder pad is received in the positioning hole. Each solder slug is received in one corresponding positioning hole and electrically connected to corresponding first and second solder pads by a reflow soldering process. The present disclosure also provides a method for manufacturing the SMT LED device.

5 Claims, 2 Drawing Sheets

LED DEVICE WITH STRUCTURE FOR PRECISELY LOCATING LEDS THEREON AND METHOD FOR MANUFACTURING THE SAME

BACKGROUND

1. Technical Field

The disclosure relates to light emitting diode (LED) devices, and particularly to an LED light bar which has LEDs mounted thereon by surface mounting technology (SMT), wherein the LEDs can be precisely mounted on the LED light bar at their intended positions.

2. Description of the Related Art

Light emitting diodes (LEDs) have many advantages, such as high luminosity, low operating voltage, low power consumption, compatibility with integrated circuits, long term reliability, and environmental friendliness which have promoted their wide use as a light source. Now, light emitting diodes are commonly applied in environmental lighting.

A conventional LED device, for example, an LED light bar, includes a circuit board and at least an LED mounted on the circuit board by surface mount technology (SMT). A bottom surface of the LED is flat and bottom portions of two electrodes of the LED are extended to the bottom surface. Solder slugs are attached on bottom faces of the bottom portions of the electrodes. When manufacturing the LED device, the LED is arranged on the circuit board which has solder pads applied thereon in advance; and the solder slugs on the bottom portions of the two electrodes are in contact with the solder pads. Then, the circuit board with the LED arranged thereon is conveyed through a reflow oven to undergo a reflow soldering process, thereby enabling the solder slugs to first melt and then solidify to fix the bottom portions of the electrodes of the LED on the circuit board. Thus, the LED is mechanically and electrically connected to the circuit board.

However, when positioned on the printed circuit board, the solder slugs on the bottom portions of the electrodes of the LED may be misaligned with the solder pads of the circuit board. When this happens, an insufficient soldering connection between the LED and the circuit board may occur, which may result in a malfunction of the LED device or an unreliable LED device.

Therefore, it is desirable to provide an SMT LED device and a method for manufacturing the SMT LED device which can overcome the described shortcomings.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure.

DETAILED DESCRIPTION

Figure 1:
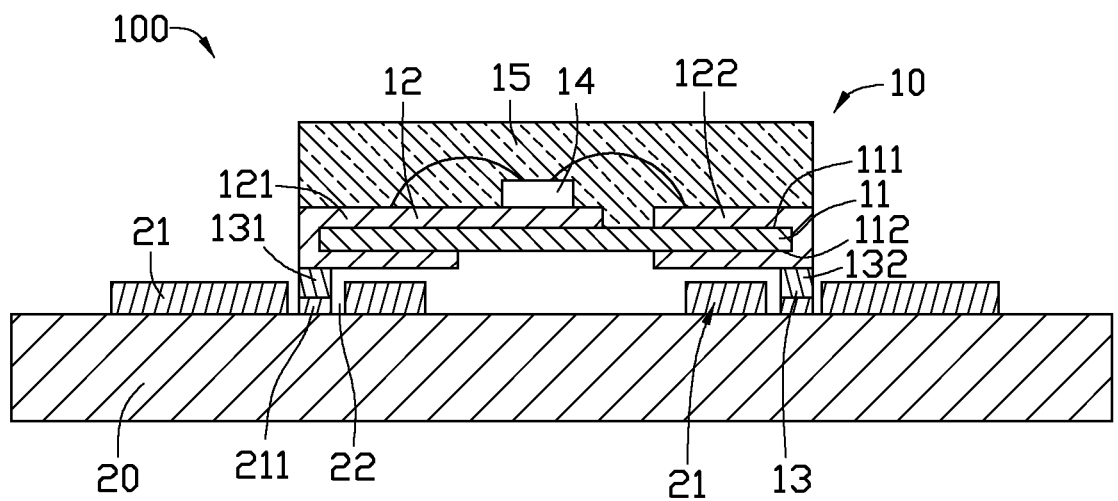
FIG. 1 is a cross-sectional view of an SMT LED device in accordance with an exemplary embodiment of the present disclosure.

Referring to FIG. 1, an LED device 100, in accordance with an exemplary embodiment, which is an LED light bar, includes an LED 10 and a circuit board 20 on which the LED 10 is surface mounted.

The LED 10 includes a substrate 11, a pair of electrodes 12 formed on the substrate 11, a pair of solder slugs 13 located at bottom faces of the pair of electrodes 12, an LED die 14 arranged on one of the electrodes 12 and electrically connected to the electrodes 12 by wires (not labeled), and an encapsulation 15 enclosing the LED die 14 and the wires therein.

Specifically, the substrate 11 is rectangular and flat, and the substrate 11 can be made of materials with excellent thermal conductivity and electrical insulation, such as ceramic, Si, GaAs, ZnO, and InP, etc. In this embodiment, the substrate 11 includes a first surface 111 and a second surface 112 opposite to the first surface 111. The first surface 111 is used for supporting the LED die 14.

The electrodes 12 are designated as a first electrode 121 and a second electrode 122 spaced from each other. The first and second electrodes 121, 122 are arranged on the substrate 11, respectively extending from the first surface 111 of the substrate 11 to the second surface 112 of the substrate 11, traversing two opposite sidewalls of the substrate 11. The pair of solder slugs 13 are designated as a first solder slug 131 and a second solder slug 132, wherein the first solder slug 131 extends downward from a lateral periphery of the bottom face of the first electrode 121, and the second solder slug 132 extends downward from a lateral periphery of the bottom face of the second electrode 122. The pair of solder slugs 13 are used to fix and electrically connect the LED 10 to the circuit board 20 by soldering. The solder slugs 13 are attached on the electrodes 12 after the electrodes 12 are secured to the substrate 11.

The LED die 14 is mounted on the first electrode 121, and electrically connected to the first electrode 121 and the second electrode 122 by wires (not labeled).

The encapsulation 15 encloses the LED die 14. The encapsulation 15 is made of silicone or epoxy resin. The encapsulation 15 can also include fluorescent materials (not shown) distributed therein according to need of emission wavelength.

Figure 2:
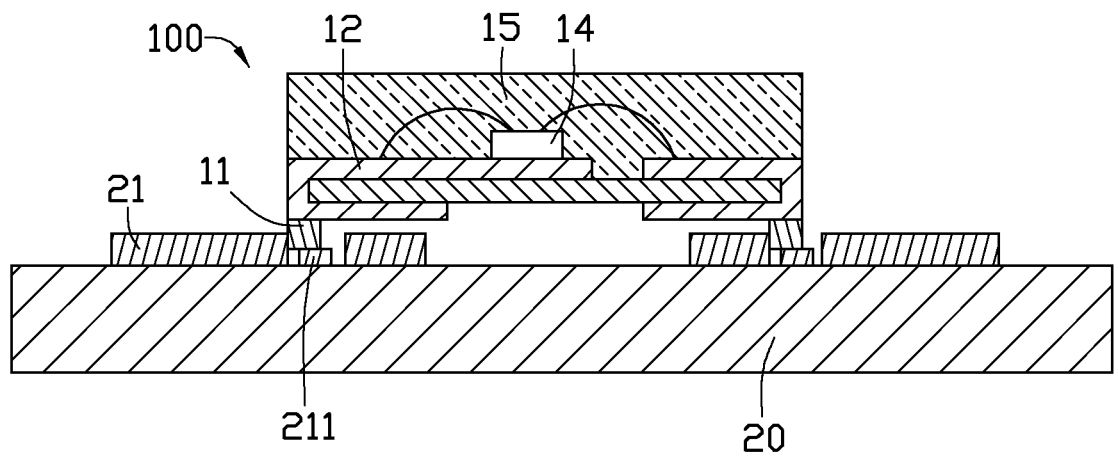
FIG. 2 is a view similar to FIG. 1, with an LED of the SMT LED device being deviated from its perfectly intended mounted position.

The circuit board 20 is used for supporting the LED 10. The LED 10 is connected to an external power by the circuit board 20. The circuit board 20 is a substantially flat plate. A pair of first solder pads 21 separated from each other are formed on the top surface of the circuit board 20 for providing electrical connection with the LED 10. The pair of first solder pads 21 are in direct physical contact with the circuit board 20. Each first solder pad 21 defines a positioning hole 22 corresponding to one of the solder slugs 13. Specifically, the first solder pad 21 is annular, and a second solder pad 211 is positioned on the circuit board 20 and in each positioning hole 22. The height of the second solder pad 211 is smaller than that of the first solder pad 21. The two second solder pads 211 are located directly below the first solder slug 131 and the second solder slug 132 respectively. The two second solder pads 211 are in direct physical contact with the circuit board 20. The first solder pads 21 and the second solder pads 211 are on a same plane defined by the circuit board 20. Referring to FIG. 2, in this embodiment, the positioning hole 22 is formed by etching the first solder pad 21 while the second solder pad 211 in the positioning hole 22 is formed by a lower part of a central portion of the first solder pad 21 which is not etched. So that there is a height difference between the first solder pad 21 and the second solder pad 211. When respectively received in the positioning holes 22, the first and second solder slugs 131, 132 each keep a distance from an inner sidewall of the first solder pad 21 defining the corresponding positioning hole 22 less than 10 microns (um), thereby ensuring the position of the LED 10 on the circuit board 20 having a relatively high accurateness. Accordingly, LEDs 10 mounted on the circuit board 20 can be precisely aligned with each other, thereby to form an LED light bar whose LEDs can precisely illuminate an edge of a light guide of an LED backlight module. FIG. 1 illustrates that each of the two solder slugs 13 is apart from the corresponding one of the pair of first solder pads 21, the distance between each of the two solder slugs 13 and the inner sidewall of the corresponding one of the pair of first solder pads 21 is less than 10 microns (um).

In this embodiment, each second solder pad 211 is spaced from the corresponding first solder pad 21. In other embodiment, the second solder pad 211 and the corresponding first solder pad 21 can also be formed as a single piece, with a height difference therebetween.

In the process of mounting the LED 10 to the circuit board 20, the LED 10 is mounted on the circuit board 20 with the first and second solder slugs 131, 132 received in the positioning holes 22 and on the second solder pads 211. Thereafter, the LED 10 and the circuit board 20 are conveyed into a reflow oven for undergoing reflow soldering, during which the first and second solder slugs 131, 132 are first melted and then solidified to thereby electrically and mechanically connect with the second solder pads 211 and the first solder pads 21. That is the LED 10 and the circuit board 20 are connected together to complete the assembly of the LED device 100. During the soldering process, since the height of the first solder pad 21 is higher than that of the second solder pad 211, the first solder pad 21 can limit the flow of the first and second solder slugs 131, 132, thereby preventing the first and second electrodes 121, 122 from deviating too much from their intended positions relative to the circuit board 21. Simultaneously, since the distance between the solder slug 13 and the first solder pad 21 is limited to be less than 10 um, the deviation of the LED 10, if it happens, can be controlled within an acceptable range. Usually, the acceptable range of deviation of the LED 10 from its intended position on the circuit board 20 is set in 50 um, which is an operational tolerance of a vacuum pick-up machine for picking the LED 10 and placing the LED 10 on the circuit board 20. Thus, the present disclosure can very precisely position the LED 10 on the circuit board 20.

In other embodiment, the height difference between the second solder pad 211 and the first solder pad 21 can also be formed by: forming the second solder pad 211 on the circuit board 20 firstly, and then performing electroplating on the circuit board 20 at a position around the second solder pad 211 to form the first solder pad 21 with the height of the first solder pad 21 being higher than that of the second solder pad 211. A space surrounded by the first solder pad 21 which receives the corresponding second solder pad 211 therein forms the positioning hole 22.

Furthermore, a method for manufacturing the LED device 100 is also provided. The method for manufacturing the LED device 100 includes the following steps.

Firstly, an LED 10 with solder slugs 13 at a bottom thereof is provided. The solder slugs 13 include a first solder slug 131 and a second solder slug 132.

Secondly, a circuit board 20 is provided with a pair of first solder pads 21 mounted on a surface thereof. A positioning hole 22 is defined in each of the first solder pads 21 corresponding to the position of one of the first solder slug 131 and the second solder slug 132. A second solder pad 211 is positioned on the circuit board 20 and in each positioning hole 22. The height of the first solder pad 21 is greater than that of the second solder pad 211.

Thirdly, the LED 10 is mounted on the circuit board 20 with the first solder slug 131 and the second solder slug 132 received in the positioning holes 22. Thereafter, the LED 10 and the circuit board 20 are conveyed into a reflow oven for reflow soldering. During the reflow soldering, the solder slugs 131, 132 are firstly melted and then solidified to electrically and mechanically connect the LED 10 and the first and second solder pads 21, 211 together. Accordingly, the LED 10 and the circuit board 20 are connected together to complete the assembly of the LED device 100.

In other embodiment, the height difference between the second solder pad 211 and the first solder pad 21 can also be formed by: forming the second solder pad 211 on the circuit board 20 firstly, and then performing electroplating on the circuit board 20 at a position around the second solder pad 211 to form the first solder pad 21 with the height of the first solder pad 21 being higher than that of the second solder pad 211. A space surrounded by the first solder pad 21 in which the corresponding second solder pad 211 is received forms the positioning hole 22.

It is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. An SMT LED device, comprising:
   an LED comprising two solder slugs at a bottom of the LED;
   a circuit board supporting the LED thereon; and
   a pair of first solder pads formed on the circuit board and spaced from each other;
   wherein a positioning hole is formed in each of the pair of first solder pads corresponding to a position of each of the two solder slugs, each of the two solder slugs being received in the positioning hole; and
   wherein a pair of second solder pads are formed on and are in direct physical contact with the circuit board, each of the pair of second solder pads is positioned in a bottom of the positioning hole and apart from the corresponding first solder pad in a horizontal direction, a height of each of the pair of second solder pads is smaller than a height of each of the pair of first solder pads, and each of the two solder slugs is electrically connected to a corresponding one of the pair of second solder pads.

2. The SMT LED device of claim 1, wherein the LED further comprises a substrate, a pair of electrodes formed on the substrate and extending from a top surface of the substrate to a bottom surface of the substrate, an LED die arranged over the substrate and electrically connected to each of the pair of electrodes, the two solder slugs each extending downward from a lateral periphery of a bottom face of a corresponding one of the pair of electrodes.

3. The SMT LED device of claim 1, wherein the pair of first solder pads physically contact the circuit board.

4. The SMT LED device of claim 1, wherein the pair of first solder pads and the pair of second solder pads are on a same plane defined by the circuit board.

5. The SMT LED device of claim 1, wherein each of the two solder slugs is apart from the corresponding one of the pair of first solder pads, and a distance between each of the two solder slugs and the inner sidewall of the corresponding one of the pair of first solder pads is less than 10 microns.

* * * * *